(12) United States Patent
Shapiro

(10) Patent No.: US 10,432,193 B2
(45) Date of Patent: Oct. 1, 2019

(54) HIGH FREQUENCY MULTI-PORT SWITCH ARCHITECTURE

(71) Applicant: pSemi Corporation, San Diego, CA (US)

(72) Inventor: Eric S. Shapiro, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 120 days.

(21) Appl. No.: 15/377,595

(22) Filed: Dec. 13, 2016

(65) Prior Publication Data

US 2018/0167064 A1 Jun. 14, 2018

(51) Int. Cl.
*H03K 17/693* (2006.01)
*H03K 17/00* (2006.01)

(52) U.S. Cl.
CPC ......... *H03K 17/693* (2013.01); *H03K 17/002* (2013.01)

(58) Field of Classification Search
CPC ............ H01P 1/24; H01P 1/26; H03H 11/245
USPC ........................................................ 326/30
See application file for complete search history.

(56) References Cited

U.S. PATENT DOCUMENTS

| | | | | |
|---|---|---|---|---|
| 7,176,710 B1* | 2/2007 | Luo | ...................... | H04L 25/0278 326/30 |
| 8,624,625 B2* | 1/2014 | Shin | ............... | H03K 19/017545 326/30 |
| 8,674,746 B1* | 3/2014 | Staudinger | ............... | H03H 7/25 327/333 |
| 9,531,359 B1* | 12/2016 | Shrivastava | ............. | H03K 5/08 |
| 2016/0241216 A1* | 8/2016 | Bawell | ....................... | H01P 1/22 |
| 2016/0373086 A1* | 12/2016 | Shrivastava | ......... | H03H 11/245 |

* cited by examiner

*Primary Examiner* — Lincoln D Donovan
*Assistant Examiner* — Colleen J O Toole
(74) *Attorney, Agent, or Firm* — Jaquez Land Greenhaus LLP; Bruce W. Greenhaus, Esq.

(57) ABSTRACT

A switch architecture suitable for use in high frequency RF applications. A switching circuit includes a common port and one or more user ports, any of which may be selectively coupled to the common port by closing an associated path switch; non-selected, unused ports are isolated from the common port by opening an associated path switch. Between each path switch and a port are associated split shunt switches for selectively coupling an associated signal path to circuit ground. Between each path switch and a port is an associated split absorptive switch module. Each split absorptive switch module includes a split resistor coupled in parallel with a switch. The combination of the split resistor and the switch of the split absorptive switch module is placed in series with a corresponding signal path from each port to the common port.

28 Claims, 6 Drawing Sheets

HIGH FREQUENCY MULTI-PORT SWITCH ARCHITECTURE

BACKGROUND

(1) Technical Field

This invention generally relates to electronic signal switching devices, and more specifically to electronic signal switching devices having a high frequency termination switch within a multi-port switch architecture.

(2) Background

In many instances today, it is useful to have a radio frequency (RF) switch architecture having a common port and several independent user ports that can each be coupled to, or isolated from, the common port. FIG. 1 is a block diagram of an RF circuit 100 having such a switch architecture. In some such architectures, all of the switches are implemented as field effect transistors (FET) switches. A common RF terminal can be selectively coupled to any of one or more RF ports: Port 1 through Port n. For example, each of the RF ports may be coupled to a respective radio antenna. The common port may be coupled to a radio transceiver, such as in a cellular phone. In the example of FIG. 1, the common port can be coupled to port 1 by closing a first path switch 102 (i.e., setting the switch 102 to "ON" by making the path through the FET a low impedance path). In addition, a first shunt switch 104 is set to "OFF" (i.e., making the path through the FET a high impedance path). A third switch 108 is set to "ON" to allow the signal to pass through to the RF Port. Lastly, a termination switch 110 is turned "OFF". A resistance 111, the value of which is selected to provide a desired termination impedance to ground, is placed in series with the termination switch 110. When the RF Port is to be isolated from the common port, the state of each of the switches 102, 104, 108, 110 is reversed. That is, switches 102 and 108 are turned "OFF" and switches 104 and 110 are turned "ON". In this state, signals that are presented to the RF Port are terminated to ground with an impedance that is determined by the series resistance of the termination resistor 111 and the on resistance of the switch 110 (which is typically nominal). The isolation switch 108 being off and the shunt switch 104 being on ensure that any leakage through the path switch 102 is shunted to ground rather than getting coupled to the RF port.

However, one problem with the switch architecture shown in FIG. 1 is that the resistor 111 may be required to dissipate a significant amount of heat when the switches are set to the terminated port condition. Furthermore, it would be desirable to reduce the total number of switches required.

Accordingly, there is a need for an efficient switch architecture suitable for use with high frequency RF signals that does not exhibit the problems of the prior art. The present invention meets this need.

SUMMARY OF THE INVENTION

A switch architecture is disclosed that comprises n split port switches. Each split port switch comprises an RF path switch, a lower shunt switch, an upper shunt switch and a split absorptive switch module. Each split port switch is coupled to an RF user port. The split absorptive switch module comprises an upper resistive element, a lower resistive element and a switch. Each of the split port switches can be configured to couple an RF common port with one or more RF ports. Alternatively, the RF Port can be isolated from the RF common port and terminated.

In the physical layout of the split port switch, the termination switch within the split absorptive switch module is coupled to the RF Port. A first terminal of the upper resistive element and the lower resistive element are connected by a conductor and connected to the first terminal of the termination switch. The second terminals of the upper and lower resistive elements are also coupled together and to the second terminal of the termination switch. The upper resistive element and the lower resistive element are spaced apart on opposite sides of the layout. The resistance of the upper and lower resistive elements are essentially the same.

The first terminals of upper and lower shunt switches are coupled together and coupled to the common port side of the termination switch. The second terminal of each shunt switch is coupled to ground. By splitting the shunt switch into an upper shunt switch and a lower shunt switch placed on opposite sides of the layout and also having two resistive elements placed on opposite sides of the termination switch, each with an independent connection to ground, parasitic interconnects are reduced. Spacing the wirebonds apart reduces the total ground inductance relative to the case in which the two wirebonds are run next to each other. In some embodiments in which the operating characteristics of the switches are essentially the same, the power will be spread evenly through the switches.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Figure 2:
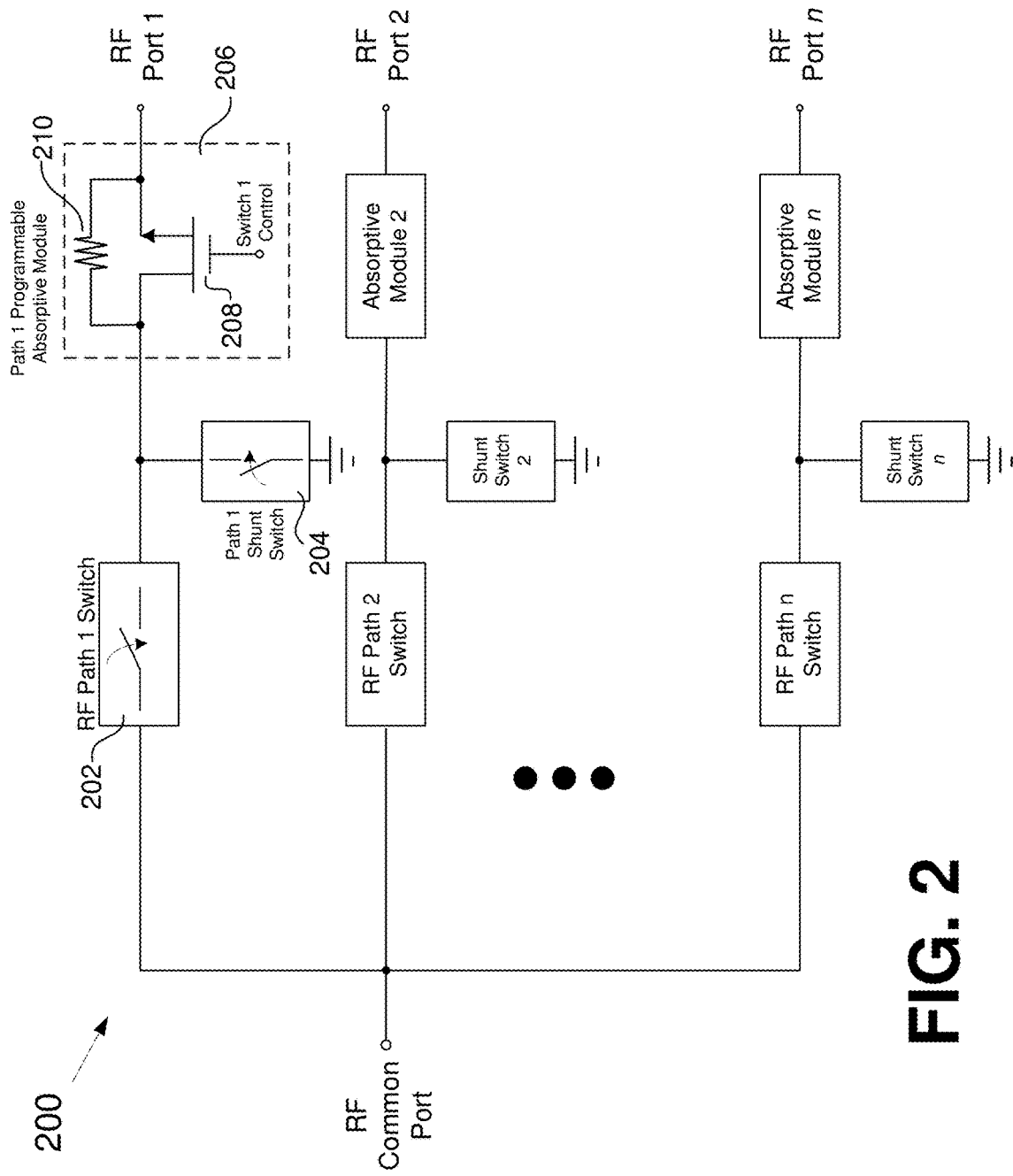
FIG. 2 is a block diagram of a radio frequency (RF) circuit having a switch architecture in accordance with the prior art.

FIG. 2 is a block diagram of one radio frequency (RF) circuit. In some such architectures, all of the switches are implemented as field effect transistor (FET) switches. In the example of FIG. 2, the common port can be coupled to port 1 by closing a first path switch 202 (i.e., setting the switch 202 to "ON" by making the path through the FET a low impedance path). In addition, a first shunt switch 204 is set to "OFF" (i.e., making the path through the FET (not shown) a high impedance path). Lastly, a switch 208 within a programmable absorptive module 206 is set to "ON" creating a low impedance "pass" state to RF port 1.

Figure 1:
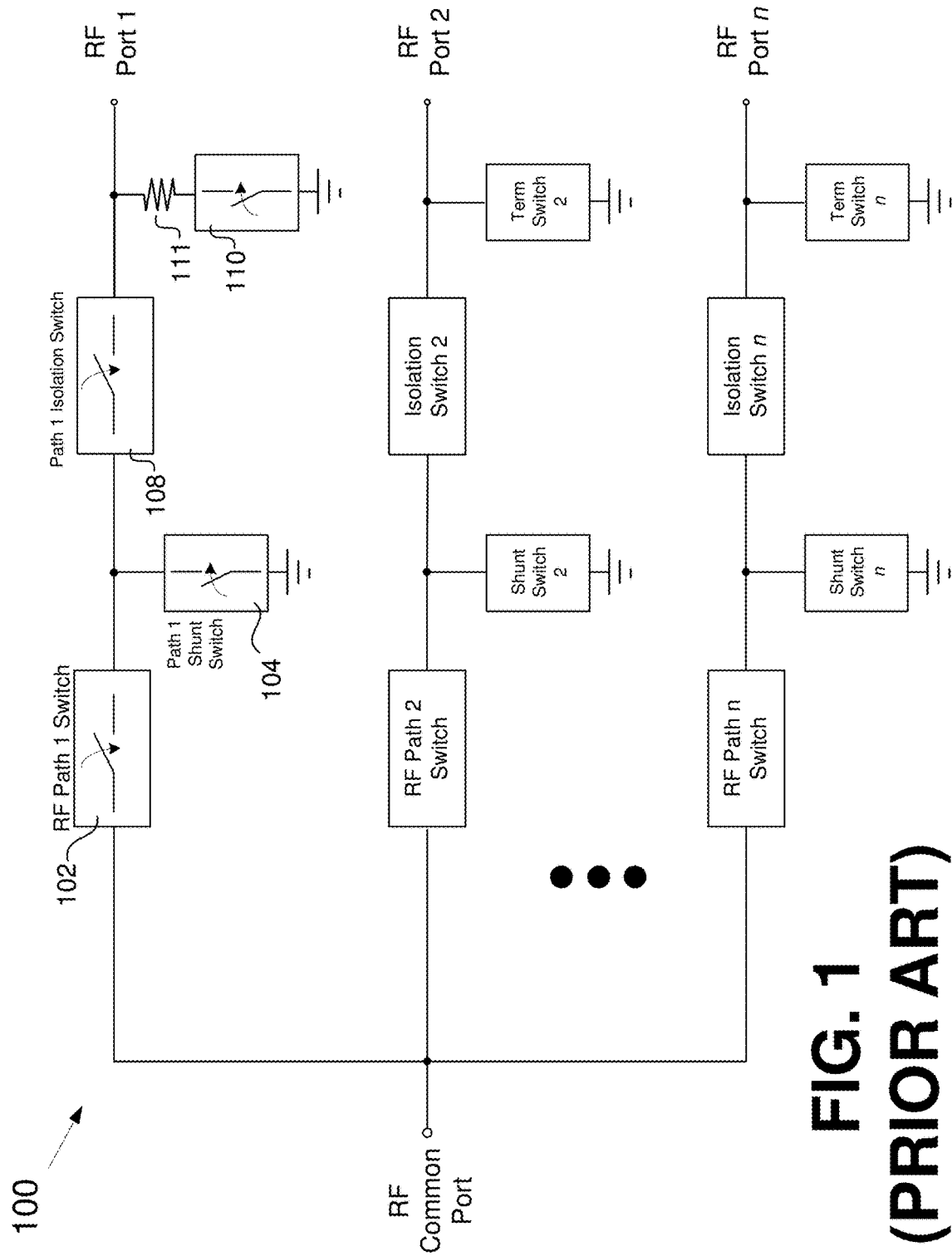
FIG. 1 is a block diagram of a prior art switch architecture.

When port 1 is to be isolated from the common port, the switch 202 is set to "OFF", the shunt switch 204 is set to "ON" and the termination switch 208 within the programmable absorptive module 206 is set to "OFF" creating a "termination" state for RF port 1. In some embodiments, the switch 208 is in parallel with a 50 ohm resistor 210. The resistor 210 in parallel with switch 208 eliminates the need for the ground downbond inductance that is required in the architecture of FIG. 1 to provide a ground path for the termination resistor 110. As can be seen from FIG. 2, the programmable absorptive module 206 comprises a FET 208 having a drain to source shunted by a resistor 210. The FET 208 is controlled by a switch control signal coupled to the gate of the FET 208. The FET 208 within the programmable absorptive module 206 is set to OFF by imposing a switch control signal on the gate of the FET 208 that biases the FET to a high impedance state. Accordingly, the impedance through the programmable absorptive module 206 is essentially equal to the resistance of the resistor 210. In some embodiments, the impedance of 210 resistor is approximately 50 ohms so that when the FET 208 is off, a signal entering port 1 is terminated (i.e., sees the 50 ohm load). In contrast, when the control signal applied to the gate of the FET 208 turns the programmable absorptive module 206 ON, the impedance through the FET 208 is relatively low compared with the resistance of the resistor 210. Therefore, in the pass state, the impedance through the programmable absorptive module 206 is very small, essentially bypassing the parallel termination resistance 210.

The path from the RF common port to each of the other paths 2 through n can likewise be controlled by setting the switches in each path appropriately.

Figure 3:
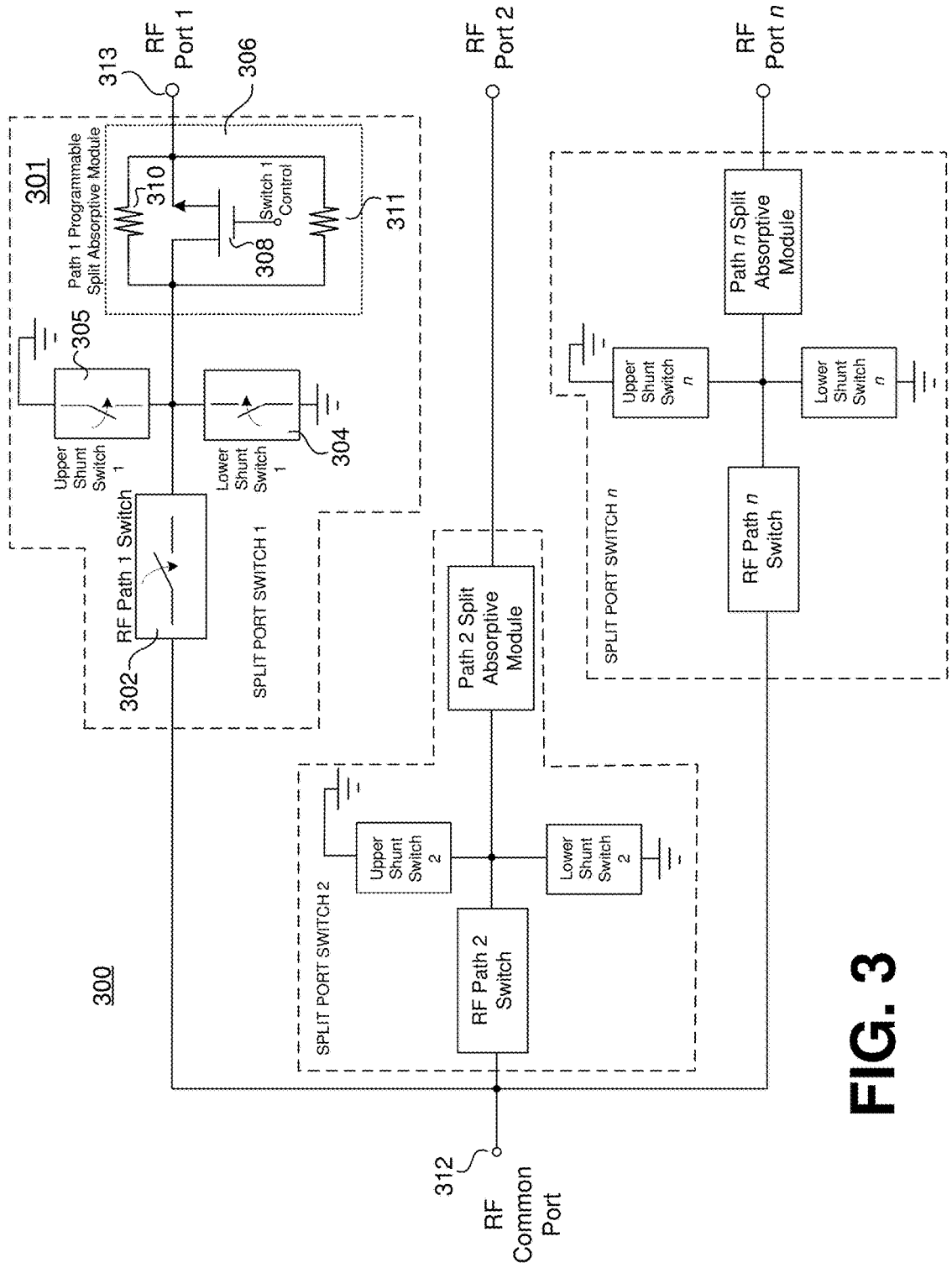
FIG. 3 is a block diagram of a circuit implementing a radio frequency (RF) switch architecture in accordance with some embodiments of the disclosed method and apparatus.

FIG. 3 is a block diagram of a circuit implementing a radio frequency (RF) switch architecture 300 in accordance with some embodiments of the disclosed method and apparatus. The switch architecture 300 comprises n split port switches 301. Each split port switch 301 comprises an RF path switch 302, at least one a lower shunt switch 304, and at least one an upper shunt switch 305 and a programmable split absorptive module 306. Each split port switch 301 is coupled to an RF user port 313. The programmable split absorptive module 306 comprises at least an upper resistive element 310, at least a lower resistive element 311 and a termination switch 308, such as a FET. The FET 308 has a low impedance in the pass state. In the termination state, the parallel pair of resistors 310, 311 are in parallel with the FET 308. Therefore, the impedance of the programmable split absorptive module 306 is essentially the off-capacitance of the FET in the OFF state in parallel with the parallel resistances 310, 311.

Each of the split port switches 301 can be configured to couple an RF common port 312 with one or more of n additional RF user ports 313. For example, an RF user Port 313 is coupled to the common port 312 by turning on (i.e., closing) the associated RF path 1 switch 302, turning off (i.e., opening) the associated upper and lower shunt switches 304, 305 and turning on (i.e., placing in the first state) the associated switch 308. In contrast, the RF user Port 313 can be isolated from the RF common port 312 and terminated by turning off the path 1 switch 302, turning on the upper and lower shunt switches 304, 305 and turning off (i.e., placing in the second state) the termination switch 308. The RF user port 313 will then see a terminated load and be isolated from the common port 312.

When configured to couple the common port 312 to a user port 313, the parallel combination of the upper resistance 310 and the lower resistance 311 will be bypassed by the ON switch 308 providing a low resistance path to the RF user port 313. In some embodiments, the reactances of the conductive lines and the switches 304, 305, 308 can be matched to cancel out any reactive component of the impedance looking into the RF user port 313 when the port 313 is isolated (i.e., with the FET 308 of the programmable split absorptive module 306 in the termination state, the shunt switches 304, 305 ON and the path switch 302 OFF).

Figure 4:
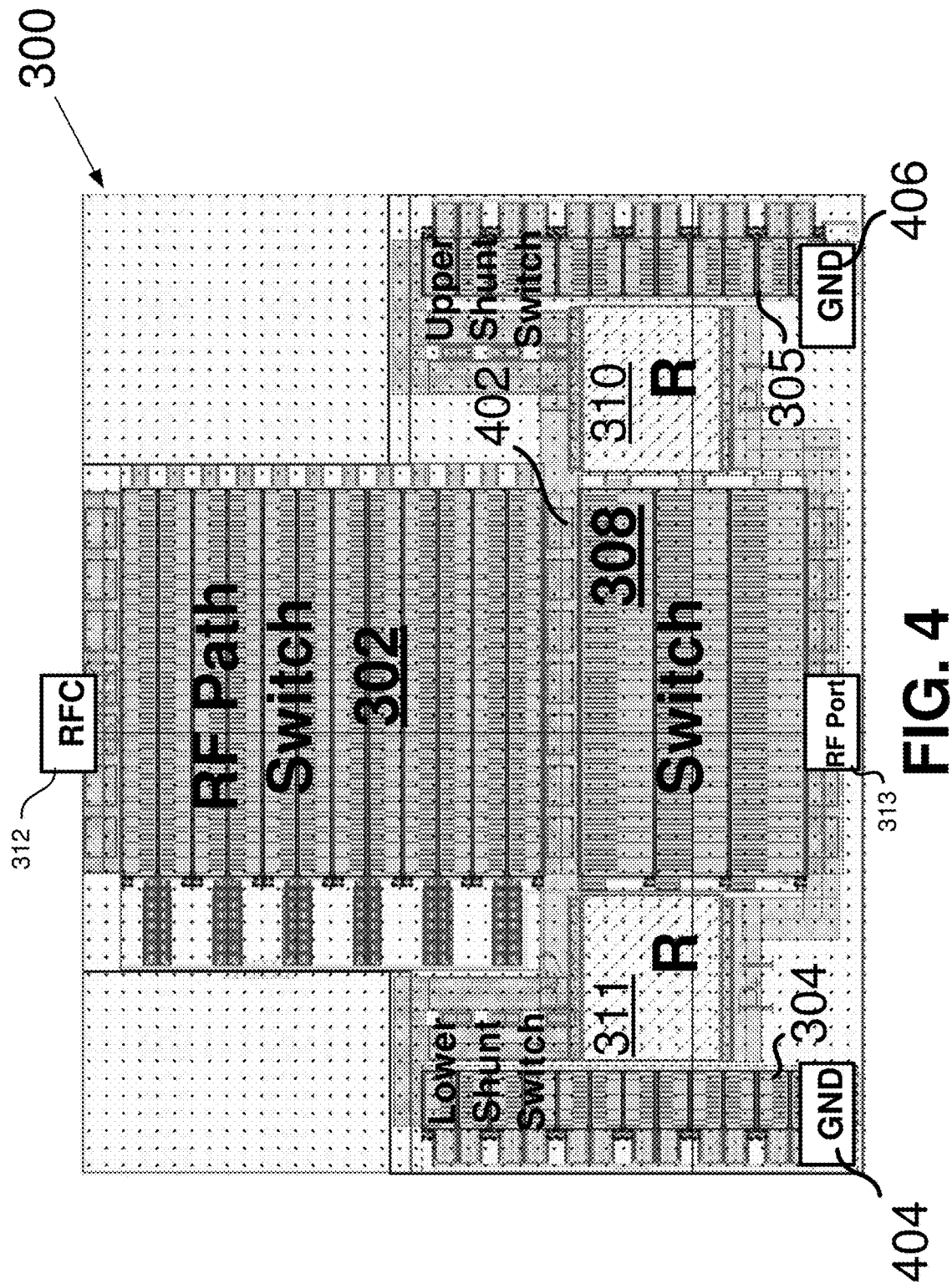
FIG. 4 is an illustration of the physical layout of one of the split port switches in accordance with one embodiment of the disclosed method and apparatus.

FIG. 4 is an illustration of the physical layout of one of the split port switches 301 in accordance with one embodiment of the disclosed method and apparatus. The RF path switch 302 is relatively large and central to the layout. In the embodiment of FIG. 4, the RF path switch 302 is fabricated as a FET having a drain coupled to the RF common port 312. The source of the FET 302 is coupled to the drain of another FET 308 within the programmable split absorptive module 306. It should be noted that in some embodiments, the source and the drain of each of the FETs shown in FIG. 4 are essentially interchangeable. The source of the FET of the programmable split absorptive module 308 is coupled to the RF Port 313. A first terminal of the upper resistive element 310 is coupled to a first terminal of the lower resistive element 311 by a conductor 402. In some embodiments, the resistance of the upper and lower resistive elements are essentially the same. In other cases, all of the operating characteristics of the resistive elements are essentially the same. That is accomplished by fabricating the resistive elements with essentially the same physical dimensions.

The conductor 402 also connects the first terminal of each of the resistive elements 310, 311 to the source of the FET 302 and the drain of the FET 308. By splitting the shunt switch into an upper shunt switch 305 and a lower shunt switch 304 the current conducted through each FET 304, 305 of the shunt switch is reduced. Separating the FETs 304, 305 allows each FET to operate at a lower temperature. Furthermore, having two resistive elements 310, 311 placed on opposite sides of the FET of the termination switch 308 with independent connections to ground reduces parasitic interconnects by reducing mutual coupling and also ensures signal symmetry. That is, having two resistive elements 310, 311, each two times the targeted termination impedance placed on opposite side of the switch 308 with independent connections to ground, parasitic effects of the interconnects and ground bonds are reduced by a factor of two. Table 1 and Table 2 show that for a single path to ground, the imaginary component of the impedance becomes as much as 63% of the total impedance. However, with a dual path to ground, the imaginary component of the impedance (while the same in each of the two paths) combines to result in a total imaginary component that is only 31% of the total impedance.

TABLE 1

| Single Path | Freq. (GHz) | $R_T$(OHMs) | $L_{gnd}$ | $Z_{real}$ | $Z_{imag}$ | % Parasitic |
| --- | --- | --- | --- | --- | --- | --- |
| | 1 | 50 | 0.5 | 50 | 3.1 | 6% |
| | 5 | 50 | 0.5 | 50 | 15.7 | 31% |
| | 10 | 50 | 0.5 | 50 | 31.4 | 63% |

TABLE 2

| Dual Path | Freq. (GHz) | $R_T$(OHMs) | $L_{gnd}$ | $Z_{real}$ | $Z_{imag}$ | % Parasitic |
| --- | --- | --- | --- | --- | --- | --- |
| | 1 | 100 | 0.5 | 100 | 3.1 | 3% |
| | 5 | 100 | 0.5 | 100 | 15.7 | 16% |
| | 10 | 100 | 0.5 | 100 | 31.4 | 31% |

Furthermore, the independent connections to ground will ensure the mutual coupling is minimized while maintaining signal symmetry. In some embodiments in which the operating characteristics of the switches 304, 305 are essentially the same, the power will be spread evenly through the switches 304, 305. In some cases, this is accomplished by fabricating the two shunt switches 304, 305 with essentially the same physical dimensions.

Figure 5:
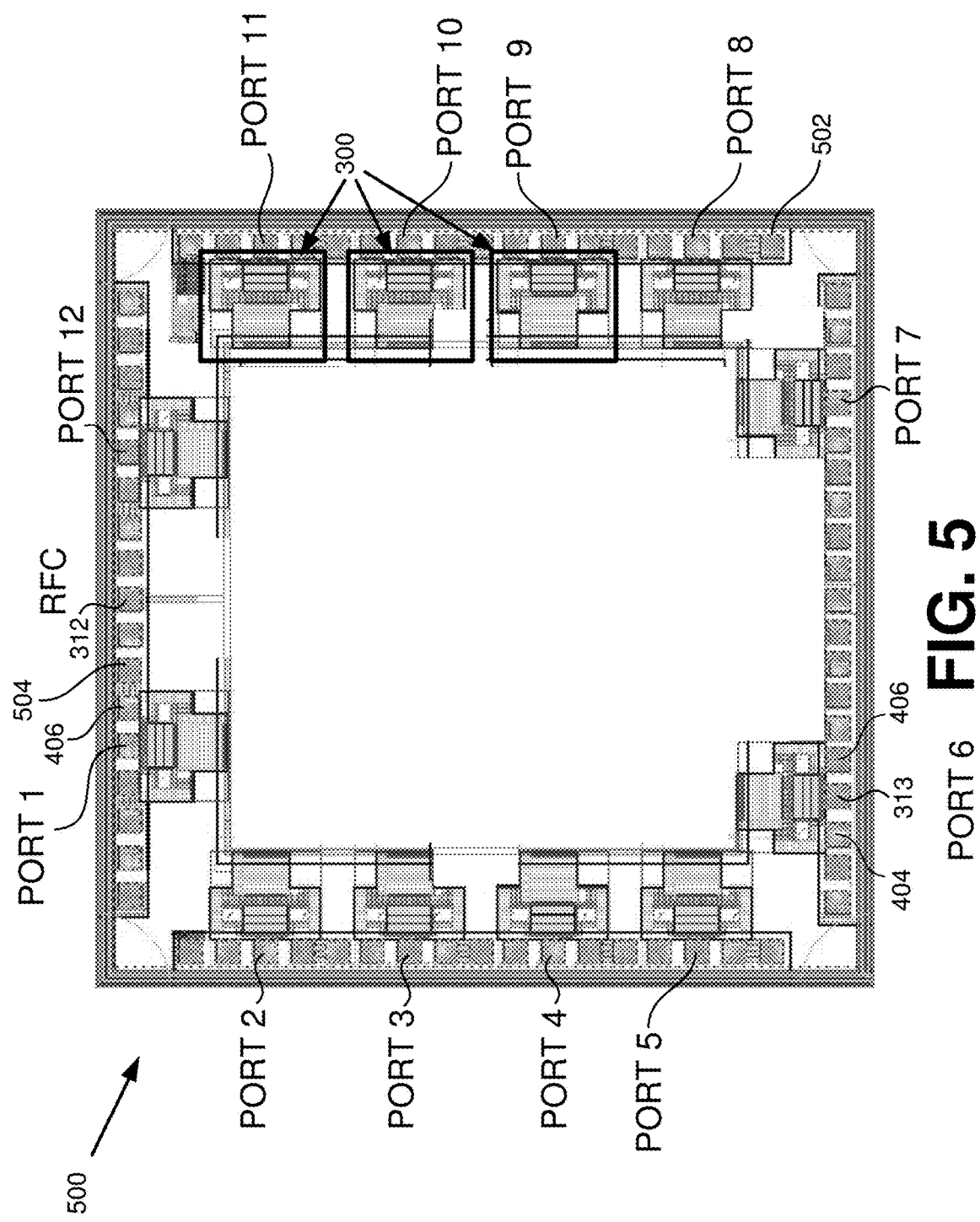
FIG. 5 is an illustration of an integrated circuit chip having several split port switches.

FIG. 5 is an illustration of an integrated circuit chip 500 having several split port switches 300. In some embodiments, each split port switch 300 is placed near the edge of the chip 500. Connection pads 502 are provided around the periphery of the chip 500. In some embodiments, additional circuitry is provided between the common port 312 and the split port switches 300. However, for the sake of simplicity, such circuitry is omitted from FIG. 5.

Figure 6:
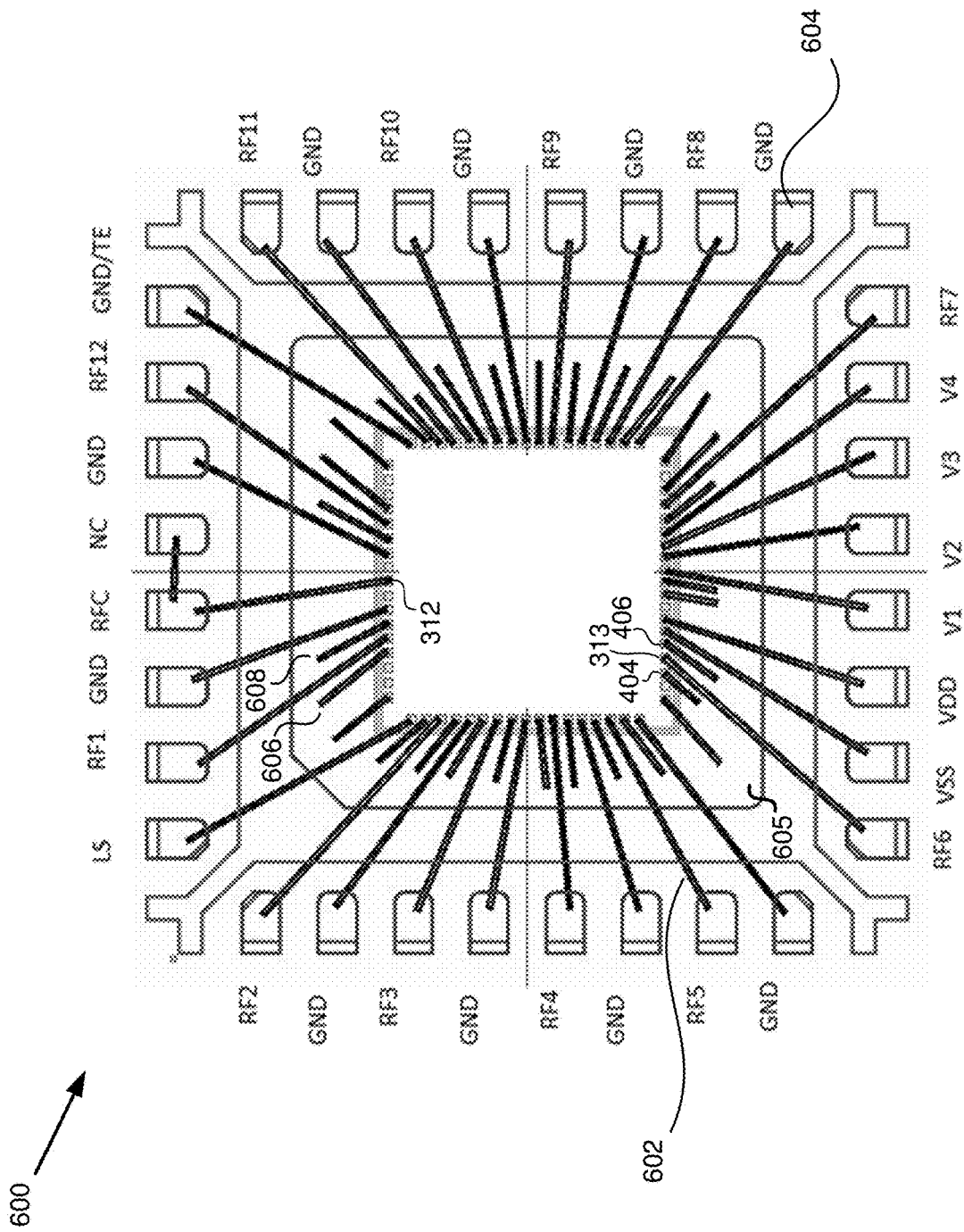
FIG. 6 is an illustration of the chip within a package.

FIG. 6 is an illustration of a package 600 in which the chip 500 has been placed. Wire bonds 602 connect the pads 502 and pins 604 of the package 600. In some embodiments, in order to reduce coupling and increase isolation between ports, or to affect other RF parameters, a pad 504 is placed next to one of the ground pads 406 and connected by a conductor. The pad 504 can then be connected to an external ground pin on the package 600.

As can be seen in FIG. 4, a first ground pad 404 provides a means by which to connect the lower shunt switch 304 to a ground paddle 605. A second ground pad 406 provides a separate means for connecting the upper shunt switch 305 to the ground paddle 605. Connections to ground are made through separate downbond wires 606, 608 (see FIG. 6). Spacing apart the two downbond wires 606, 608 minimizes the mutual inductance between them. In addition, splitting the resistive elements 310, 311 allows the use of a larger area for the resistive elements 310, 311, thus reducing the amount the temperature will rise as a result of power dissipating in the resistive elements 310, 311 when power is applied to the RF port 313 and terminated. An example is that 311 and 310 may be approximately equal to 100 ohms. Thus, in parallel they become near 50 ohms. But since they are further from each other, they won't heat each other up as much so the die temperature remains more under control. The thermal advantages attained by splitting the shunt switches 304, 305 and the resistances 310, 311 are realized even in the case in which the architecture is a flip-chip that has no wirebonds. The layout of FIG. 3 lends itself to a lower cost solution by lowering the downbond inductance effect through splitting the shunt switch connection as described and also creating a ground-signal-ground environment for the port RF signal. The ground-signal-ground environment helps to control the impedance, isolation, and tuning for broadband higher frequency performance.

A method in accordance with some embodiments is disclosed for terminating at least one unused port 313 of a switching circuit 300. Some such methods include a first step of providing a switch architecture 300. The switch architecture includes a common port 312 having least one split port switch 301. The split port switch 301 includes a path switch 302 coupled to the common port 312 and a programmable split absorptive module 306 coupled in series with the path switch 302 and a port 313. The programmable split absorptive module 306 includes an FET 308 and at least two split resistive elements 310, 311 coupled in parallel. In one such embodiment, the termination switch 308 has the characteristics of a large resistor with parallel capacitor in a first state and of a small resistance in a second state. The split port switch 301 further includes at least two split shunt switches 304, 305. The two split shunt switches 304, 305 are symmetrically placed on opposite sides of the path switch 302. In one such method, each switch 304, 305 is provided with a first terminal coupled to both the termination switch 308 of the programmable split absorptive module 306 and to the path switch 302. In addition, each split shunt switch 304, 305 is provided with a second terminal coupled to a separate ground 404, 406, for selectively coupling the signal path to ground.

Such an embodiment further includes a second step of selectively isolating a signal path from the common port. Selectively isolating the signal path is done by: (1) selecting a state for the path switch that decouples the signal path from the common port; (2) selecting a state for each split shunt switch that couples the signal path to ground; and (3) selecting a state for the absorptive switch module in which the switch is set to a state that causes the absorptive switch module to behave as a parallel resistor-capacitor network.

As should be readily apparent to one of ordinary skill in the art, various embodiments of the invention can be implemented to meet a wide variety of specifications. Thus, selection of suitable component values are a matter of design choice (so long as the frequencies of interest mentioned above can be handled). The switching and passive elements may be implemented in any suitable integrated circuit (IC) technology, including but not limited to MOSFET and IGFET structures. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, "stacking" components to handle greater voltages, and/or using multiple components in parallel to handle greater currents.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A switching circuit having a common port coupled to a split absorptive module, wherein the split absorptive module includes a termination switch and at least an upper resistive element and a lower resistive element, each of the resistive elements coupled parallel to one another and parallel to and on opposite sides of the termination switch, such that the upper resistive element is spaced apart from the lower resistive element and the termination switch resides in the space between the upper and lower resistive elements, the termination switch having characteristics of a resistor in a first state and of a smaller resistance in a second state.

2. The switching circuit of claim 1, wherein the first and second resistive elements have essentially the same operational characteristics.

3. The switching circuit of claim 1, wherein the first and second resistive elements have essentially the same resistance.

4. The switching circuit of claim 1 wherein the first and second resistive elements have essentially the same physical dimensions.

5. The switching circuit of claim 1, further having at least two shunt switches, each having a first terminal coupled between the common port and the termination switch module and a second terminal coupled to ground.

6. The switching circuit of claim 5, wherein the at least two shunt switches are spaced apart, each on opposite sides of the termination switch.

7. The switching circuit of claim 6, wherein the at least two shunt switches have essentially identical operational characteristics.

8. The switching circuit of claim 6, wherein the at least two shunt switches have essentially identical physical dimensions.

9. The switching circuit of claim 6, wherein a first of the at least two resistive elements resides on one side of the termination switch adjacent one of the at least two shunt switches and at least a second of the at least two resistive elements resides on the opposite side of the termination switch adjacent a second of the at least two shunt switches.

10. An RF switching circuit including:
(a) a common port; and
(b) one or more signal paths, wherein at least one signal path includes:
  (1) an absorptive switch module having a first and second terminal, the absorptive switch module further having a termination switch, a first resistive element and a second resistive element coupled in parallel to one another between the first and second terminal of the absorptive switch module;
  (2) at least two shunt switches, each having a first terminal coupled to ground and a second terminal coupled to the first terminal of the termination switch; and
  (3) a path switch having a first terminal coupled to the common port and a second terminal coupled to the first terminal of the termination switch;
wherein the first and second resistive elements are spaced apart on opposite sides of the termination switch within the absorptive switch module, such that the termination switch resides in the space between the first and second resistive elements.

11. The switching circuit of claim 10, wherein the first and second resistive elements have essentially the same resistance and physical dimensions.

12. The RF switching circuit of claim 10, wherein the at least two shunt switches are spaced apart on opposite sides of the termination switch.

13. The RF switching circuit of claim 10, wherein the at least two shunt switches have essentially the same operational characteristics and physical dimensions.

14. The RF switching circuit of claim 10, wherein the termination switch of the absorptive switch module has characteristics of a resistor in a first state and of a resistor with capacitor in a second state, such that the absorptive switch module behaves as a resistor-capacitor network when the termination switch is in the second state, and the at least two shunt switches have characteristics of an inductor-resistor network in a shunt switch first state.

15. The RF switching circuit of claim 14, wherein the resistor-capacitor network behavior of the absorptive switch module functions as a negative inductance that substantially offsets a positive inductive reactance behavior of the inductor-resistor network characteristics of the shunt switches for signal frequencies within the range of about 1 to about 40 GHz.

16. The RF switching circuit of claim 10, wherein the termination switch is a FET.

17. The RF switching circuit of claim 10, wherein the switching circuit is fabricated as an integrated circuit.

18. The RF switching circuit of claim 10, wherein the switching circuit is appropriate for switching RF signals at frequencies within a range of about 1 to about 40 GHz.

19. A method for terminating one or more unused ports of a switching circuit, including:
(a) coupling the at least one unused port to a first terminal of an absorptive switch module, wherein the absorptive switch module includes a termination switch, a first resistive element and second resistive element, each coupled in parallel to one another and in parallel between the first terminal and a second terminal of the absorptive switch module, placing the first resistive element on a first side of the termination switch and the second resistive element on the opposite side of the termination switch, such that first resistive element and the second resistive element are spaced apart and the termination switch resides in the space between the first and second resistive elements and wherein the termination switch has characteristics of a resistor in a first state and of a capacitor in a second state;
(b) providing at least two shunt switches, each having a first terminal coupled to the second terminal of the absorptive switch module and a second terminal coupled to ground;
(c) placing the termination switch in the second state; and
(d) closing the at least two shunt switches.

20. The method of claim 19, wherein the termination switch is a field effect transistor (FET) switch.

21. The method of claim 19, wherein the first and second resistive element have essentially the same physical dimensions and operating characteristics.

22. The method of claim 19, further including placing a first of the at least two shunt switches on a first side of the termination switch and a second of the at least two shunt switches on the opposite side of the termination switch.

23. The method of claim 22, wherein the first and second shunt switches have essentially the same physical dimensions and operating characteristics.

24. The method of claim 19, further including:
(a) providing a common port;
(b) providing a path switch having a first terminal coupled to the common port and having a second terminal coupled to the second terminal of the absorptive switch module; and
(c) opening the path switch.

25. The method of claim 24, wherein at least one of the path switch and each of the shunt switches are FETs.

26. The method of claim 24, further including creating a path from the common port to the at least one unused port, including:
(a) closing the path switch;
(b) opening each of the at least two shunt switches; and
(c) placing the termination switch in the first state.

27. An RF switching circuit having at least one user port coupled to an absorptive switch module, wherein the absorptive switch module includes switch means for selectively passing or blocking an RF signal, and at least two resistive elements coupled in parallel to one another and in parallel with the switch means, the first resistive element placed on a first side of the termination switch and spaced apart from the second resistive element, which is placed on the opposite side of the termination switch, wherein the switch means resides in the space between the first and second resistive element and has the characteristics of a resistor in a first state and of a capacitor in a second state.

28. The RF switching circuit of claim 27, further including:
   (a) a common port means for communicating a signal to or from one or more signal sources/destinations;
   (b) at least one path switch means, each having a first terminal coupled to the common port and a second terminal coupled to the absorptive switch module, for selectively establishing a signal path from the common port to the user port through the corresponding absorptive switch module;
   (c) a shunt switch means coupled to the second terminal of an associated one of the at least one path switch means, for selectively coupling the second terminal of the corresponding path switch means to ground.

\* \* \* \* \*